(12) United States Patent
Du et al.

(10) Patent No.: US 12,136,389 B2
(45) Date of Patent: Nov. 5, 2024

(54) TERMINAL DEVICE, DISPLAY APPARATUS, DISPLAY PANEL AND MANUFACTURING METHOD THEREOF

(71) Applicants: Chengdu BOE Optoelectronics Technology Co., Ltd., Chengdu (CN); BOE TECHNOLOGY GROUP CO., LTD., Beijing (CN)

(72) Inventors: Lili Du, Beijing (CN); Yue Long, Beijing (CN); Weiyun Huang, Beijing (CN); Benlian Wang, Beijing (CN); Qiwei Wang, Beijing (CN); Yudiao Cheng, Beijing (CN)

(73) Assignees: CHENGDU BO OPTOELECTRONICS TECHNOLOGY., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 557 days.

(21) Appl. No.: 17/427,151

(22) PCT Filed: Nov. 6, 2020

(86) PCT No.: PCT/CN2020/127186
§ 371 (c)(1),
(2) Date: Jul. 30, 2021

(87) PCT Pub. No.: WO2022/067965
PCT Pub. Date: Apr. 7, 2022

(65) Prior Publication Data
US 2022/0376000 A1    Nov. 24, 2022

(30) Foreign Application Priority Data
Sep. 30, 2020  (WO) ............... PCT/CN2020/119673

(51) Int. Cl.
*H10K 59/65* (2023.01)
*G09G 3/3225* (2016.01)
(Continued)

(52) U.S. Cl.
CPC ......... *G09G 3/3225* (2013.01); *G09G 3/3233* (2013.01); *G09G 3/3275* (2013.01);
(Continued)

(58) Field of Classification Search
CPC ............................ H10K 59/65; G09G 3/3225
See application file for complete search history.

(56) References Cited

U.S. PATENT DOCUMENTS 9,153,169 B2   10/2015  Yamashita et al.
10,186,191 B2   1/2019  Kang et al.
(Continued)

FOREIGN PATENT DOCUMENTS

CN    106469743 A    3/2017
CN    107610635 A    1/2018
(Continued)

OTHER PUBLICATIONS

International Search Report and Written Opinion for International Application No. PCT/CN2021/080494 mailed Apr. 7, 2022.
(Continued)

*Primary Examiner* — Douglas M Menz
(74) *Attorney, Agent, or Firm* — Perilla Knox & Hildebrandt LLP; Kenneth A. Knox

(57) ABSTRACT

The present disclosure relates to a terminal device, a display apparatus, a display panel, and a manufacturing method thereof, which is related to the field of display. The display panel includes a drive back plate, having a light transmitting region and a drive region at least partially surrounding the light transmitting region, wherein the drive region has a plurality of pixel circuits and at least includes first pixel
(Continued)

circuits and second pixel circuits; a transfer layer, provided on a side of the drive back plate and including a plurality of layers of mutually insulated lead layers, wherein each of the lead layers includes a plurality of mutually insulated leads; each lead extends from the light transmitting region to the drive region and is connected to one of the first pixel circuits; a light emitting layer, provided on a side of the transfer layer away from the drive back plate.

20 Claims, 9 Drawing Sheets

(51) Int. Cl.
*G09G 3/3233* (2016.01)
*G09G 3/3275* (2016.01)
*H10K 50/86* (2023.01)
*H10K 59/121* (2023.01)
*H10K 59/131* (2023.01)
*H10K 59/35* (2023.01)
*H10K 59/88* (2023.01)
*H10K 71/00* (2023.01)
*H10K 59/12* (2023.01)

(52) U.S. Cl.
CPC ......... *H10K 50/865* (2023.02); *H10K 59/121* (2023.02); *H10K 59/1213* (2023.02); *H10K 59/1216* (2023.02); *H10K 59/131* (2023.02); *H10K 59/351* (2023.02); *H10K 59/65* (2023.02); *H10K 59/88* (2023.02); *H10K 71/00* (2023.02); *H10K 71/621* (2023.02); *G09G 2300/0413* (2013.01); *G09G 2300/0426* (2013.01); *G09G 2300/0819* (2013.01); *G09G 2300/0842* (2013.01); *G09G 2310/0272* (2013.01); *G09G 2310/08* (2013.01); *H10K 59/1201* (2023.02); *H10K 59/353* (2023.02)

(56) References Cited

U.S. PATENT DOCUMENTS

| | | | |
|---|---|---|---|
| 10,290,694 B2 | 5/2019 | Xiang et al. | |
| 10,409,099 B2 | 9/2019 | Hsiao | |
| 10,482,811 B2 | 11/2019 | Kang et al. | |
| 10,672,340 B2 | 6/2020 | Li et al. | |
| 10,707,281 B2* | 7/2020 | Kuo | G09G 3/3225 |
| 10,733,931 B2 | 8/2020 | Jung et al. | |
| 10,756,136 B1 | 8/2020 | Ma et al. | |
| 10,854,124 B2 | 12/2020 | Yang et al. | |
| 11,114,032 B2 | 9/2021 | Bian | |
| 11,183,544 B2 | 11/2021 | Zhang | |
| 11,227,538 B2 | 1/2022 | Yang et al. | |
| 11,727,849 B2 | 8/2023 | Lu et al. | |
| 11,810,505 B2 | 11/2023 | Lee et al. | |
| 11,847,964 B2 | 12/2023 | Huang et al. | |
| 11,862,081 B2 | 1/2024 | Cheng et al. | |
| 2009/0179838 A1 | 7/2009 | Yamashita et al. | |
| 2013/0083080 A1 | 4/2013 | Rappoport et al. | |
| 2016/0358576 A1 | 12/2016 | Lee et al. | |
| 2017/0162111 A1 | 6/2017 | Kang et al. | |
| 2017/0200777 A1 | 7/2017 | Li et al. | |
| 2018/0166017 A1 | 6/2018 | Li et al. | |
| 2018/0219058 A1 | 8/2018 | Xiang et al. | |
| 2018/0293936 A1 | 10/2018 | Fujioka | |
| 2018/0308417 A1 | 10/2018 | Xie et al. | |
| 2018/0366066 A1 | 12/2018 | Kim et al. | |
| 2019/0004354 A1 | 1/2019 | Hsiao | |
| 2019/0096962 A1 | 3/2019 | Han et al. | |
| 2019/0122608 A1 | 4/2019 | Kang et al. | |
| 2020/0051497 A1 | 2/2020 | Kang et al. | |
| 2020/0052048 A1 | 2/2020 | Kuo et al. | |
| 2020/0194532 A1 | 6/2020 | Lee et al. | |
| 2020/0251539 A1 | 8/2020 | Fu | |
| 2020/0312209 A1 | 10/2020 | Yang et al. | |
| 2020/0411610 A1 | 12/2020 | Zhang | |
| 2021/0043135 A1 | 2/2021 | Zhao et al. | |
| 2021/0090501 A1 | 3/2021 | Wu et al. | |
| 2021/0351255 A1 | 11/2021 | Chang et al. | |
| 2022/0069047 A1 | 3/2022 | Yang et al. | |
| 2022/0093682 A1 | 3/2022 | Chang et al. | |
| 2022/0189394 A1 | 6/2022 | Yang | |
| 2022/0293692 A1 | 9/2022 | Xu et al. | |
| 2022/0343862 A1 | 10/2022 | Cheng et al. | |
| 2022/0376000 A1 | 11/2022 | Du et al. | |
| 2023/0410719 A1 | 12/2023 | Park et al. | |

FOREIGN PATENT DOCUMENTS

| | | |
|---|---|---|
| CN | 107610645 A | 1/2018 |
| CN | 108010947 A | 5/2018 |
| CN | 207425860 U | 5/2018 |
| CN | 108365123 A | 8/2018 |
| CN | 108389879 A | 8/2018 |
| CN | 108445684 A | 8/2018 |
| CN | 108922482 A | 11/2018 |
| CN | 109037287 A | 12/2018 |
| CN | 109671759 A | 4/2019 |
| CN | 109742128 A | 5/2019 |
| CN | 109801950 A | 5/2019 |
| CN | 109904214 A | 6/2019 |
| CN | 109950288 A | 6/2019 |
| CN | 110061014 A | 7/2019 |
| CN | 110232892 A | 9/2019 |
| CN | 110265455 A | 9/2019 |
| CN | 110459175 A | 11/2019 |
| CN | 110603578 A | 12/2019 |
| CN | 110634930 A | 12/2019 |
| CN | 209731298 U | 12/2019 |
| CN | 110767157 A | 2/2020 |
| CN | 110767174 A | 2/2020 |
| CN | 110767681 A | 2/2020 |
| CN | 110767720 A | 2/2020 |
| CN | 110825264 A | 2/2020 |
| CN | 110874990 A | 3/2020 |
| CN | 110890026 A | 3/2020 |
| CN | 110969982 A | 4/2020 |
| CN | 111048005 A | 4/2020 |
| CN | 210245501 U | 4/2020 |
| CN | 111180494 A | 5/2020 |
| CN | 111211152 A | 5/2020 |
| CN | 210515985 U | 5/2020 |
| CN | 111261677 A | 6/2020 |
| CN | 111261684 A | 6/2020 |
| CN | 111326560 A | 6/2020 |
| CN | 111402743 A | 7/2020 |
| CN | 111446282 A | 7/2020 |
| CN | 111508377 A | 8/2020 |
| CN | 2020155555 A | 8/2020 |
| CN | 111725287 A | 9/2020 |
| CN | 107610635 B | 3/2021 |
| EP | 3176772 A1 | 6/2017 |
| EP | 3176772 B1 | 4/2019 |
| JP | 2016001303 A | 1/2016 |
| JP | 2018180110 A | 11/2018 |
| JP | 2020038758 A | 3/2020 |
| WO | 2018196149 A1 | 11/2018 |
| WO | 2020049811 A1 | 3/2020 |
| WO | 2021000625 A1 | 1/2021 |
| WO | 2021016926 A1 | 2/2021 |

OTHER PUBLICATIONS

International Search Report and Written Opinion for International Application No. PCT/CN2020/127256 mailed Apr. 7, 2022.
International Search Report and Written Opinion for International Application No. PCT/CN2020/124401 mailed Apr. 7, 2022.
Notice of Allowance for U.S. Appl. No. 17/789,007 of Aug. 1, 2023.
Written Opinion of International Application No. PCT/CN2020/127186 mailed Jul. 6, 2021.

(56) References Cited

OTHER PUBLICATIONS

Written Opinion of International Application No. PCT/CN2020/119673 mailed Jun. 23, 2021.
Non-Final Office Action for U.S. Appl. No. 17/433,292 mailed Feb. 17, 2023.
Non-Final Office Action for U.S. Appl. No. 18/477,479 of May 3, 2024.
Non-Final Office Action for U.S. Appl. No. 18/385,071 of Jun. 4, 2024.
Notice of Allowance for U.S. Appl. No. 17/423,885 of Jun. 12, 2024.
First Office Action for JP Patent Application No. 2023-518291 of Jul. 22, 2024.

* cited by examiner

TERMINAL DEVICE, DISPLAY APPARATUS, DISPLAY PANEL AND MANUFACTURING METHOD THEREOF

CROSS-REFERENCE TO RELATED APPLICATIONS

The present disclosure is a 35 U.S.C. § 371 national phase application of International Application No. PCT/CN2020/127186 entitled "TERMINAL DEVICE, DISPLAY APPARATUS, DISPLAY PANEL AND MANUFACTURING METHOD THEREOF," filed Nov. 6, 2020, which claims the benefit of and priority to International Application No. PCT/CN2020/119673 entitled "DISPLAY PANEL AND DISPLAY APPARATUS," filed on Sep. 30, 2020, the contents of both of which being incorporated by reference in their entireties herein.

TECHNICAL FIELD

The present disclosure relates to the field of display and, in particular, relates to a terminal device, a display apparatus, a display panel, and a manufacturing method thereof.

BACKGROUND

As for a screen of the electronic device having a camera, such as mobile phones, tablets, etc., a region of the screen corresponding to the camera usually requires a hole to be opened so that it cannot emit light, which is not conducive to increasing the screen-to body ratio of the electronic device. Currently, there is under-screen camera shooting technology, such that the region where the camera is located can also display an image, which avoids opening a hole, and the images can be taken normally. However, the region of the screen corresponding to the camera has low luminance, thereby affecting the display effect of the entire screen.

It should be noted that the above information disclosed in the BACKGROUND is only for enhancing the understanding of the background of the present disclosure, so it may include information that does not constitute prior art known to those of ordinary skill in the art.

SUMMARY

The present disclosure relates to providing a terminal device, a display apparatus, a display panel, and a manufacturing method thereof.

According to an aspect of the present disclosure, there is provided a display panel, including:

a drive back plate, having a light transmitting region and a drive region at least partially surrounding the light transmitting region, wherein the drive region has a plurality of pixel circuits and at least includes first pixel circuits and second pixel circuits;

a transfer layer, provided on a side of the drive back plate and including a plurality of layers of mutually insulated lead layers, wherein each of the lead layers includes a plurality of mutually insulated leads; each lead extends from the light transmitting region to the drive region and is connected to one of the first pixel circuits;

a light emitting layer, provided on a side of the transfer layer away from the drive back plate and including a plurality of light emitting devices, wherein the light emitting device includes a plurality of first light emitting devices located in the light transmitting region and a plurality of second light emitting devices located in the drive region, wherein the first light emitting devices are connected to the first pixel circuits in a one-to-one correspondence through the leads in each lead layer; and the second pixel circuits are connected to the second light emitting devices in a one-to-one correspondence.

In an exemplary embodiment of the present disclosure, the light emitting device includes:

a first electrode, provided on a surface of the transfer layer away from the drive back plate, wherein the first electrode has an electrode portion and a wiring portion located outside an edge of the electrode portion; each of the first electrodes is connected to one of the leads through the wiring portion and a transfer hole in the transfer layer;

a light emitting function layer, provided on a surface of the first electrode away from the drive back plate;

a second electrode provided on a surface of the light emitting function layer away from the drive back plate.

In an exemplary embodiment of the present disclosure, a plurality of layers of the lead layers at least includes a first lead layer, a second lead layer, and a third lead layer that are sequentially distributed from the drive back plate to the light emitting layer; a lead of the first lead layer includes a first lead, a lead of the second lead layer includes a second lead, and a lead of the third lead layer includes a third lead;

a region of the transfer layer corresponding to the light emitting region includes a plurality of routing regions distributed in an array, each of the routing regions includes a target routing region, the target routing region is located at a side of a first central axis, and the target routing region includes a first sub-region, a second sub-region, a third sub-region sequentially distributed towards the first central axis along a row direction; the first central axis is a central axis of the light transmitting region along a column direction;

transfer holes in the first sub-region are first transfer holes, transfer holes in the second sub-region are second transfer holes, and transfer holes in the third sub-region are third transfer holes;

a wiring portion corresponding to the first sub-region is connected to the corresponding first pixel circuit through the first transfer hole and the first lead; a wiring portion corresponding to the second sub-region is connected to the corresponding first pixel circuit through the second transfer hole and the second lead; and a wiring portion corresponding to the third sub-region is connected to the corresponding first pixel circuit through the third transfer hole and the third lead.

In an exemplary embodiment of the present disclosure, in the first sub-region, the first transfer holes are distributed in N rows and M columns, and at most M first leads are distributed between the first transfer holes of any adjacent two rows, both N and M are positive integers.

In an exemplary embodiment of the present disclosure, in the second sub-region, the second transfer holes are distributed in N rows and M columns, and at most M second leads are distributed between the second transfer holes of any adjacent two rows.

In an exemplary embodiment of the present disclosure, in the third sub-region, the third transfer holes are distributed in N rows and M columns, and at most M third leads are distributed between the third transfer holes of any adjacent two rows.

In an exemplary embodiment of the present disclosure, the target routing region further includes a fourth sub-region, the fourth sub-region is located at a side of the third sub-region away from the first sub-region, transfer holes in the fourth sub-region are fourth transfer holes;

the lead of the first lead layer further includes a fourth lead insulated from the first lead; and at least a portion of the wiring portion corresponding to the fourth sub-region is connected to the corresponding first pixel circuit through the fourth transfer hole and the fourth lead.

In an exemplary embodiment of the present disclosure, the lead of the second lead layer further includes a fifth lead insulated from the second lead; and at least a portion of the wiring portion corresponding to the fourth sub-region is connected to the corresponding first pixel circuit through the fourth transfer hole and the fifth lead.

In an exemplary embodiment of the present disclosure, the lead of the third lead layer further includes a sixth lead insulated from the third lead; and at least a portion of the wiring portion corresponding to the fourth sub-region is connected to the corresponding first pixel circuit through the fourth transfer hole and the sixth lead.

In an exemplary embodiment of the present disclosure, the fourth sub-region includes a first secondary sub-region and a second secondary sub-region, the first secondary sub-region and the second secondary sub-region are symmetrical with respect to a second central axis, and the lead in the first secondary sub-region region and the lead in the second secondary sub-region are symmetrical with respect to the second central axis; the second central axis is a central axis of the target routing region along the row direction.

In an exemplary embodiment of the present disclosure, the first lead, the second lead and the third lead include:
a lead-out section, extending along the column direction and connected to the transfer hole;
an extension section, extending in the row direction, and having one end connected to the lead-out section and the other end extending to a region of the transfer layer corresponding to the drive region.

In an exemplary embodiment of the present disclosure, the fourth lead, the fifth lead and at least a portion of the sixth lead includes:
a lead-out section, extending along the column direction and connected to the transfer hole;
an extension section, including a first extension section and a second extension section, wherein the first extension section extends along the row direction, and has one end connected to the lead-out section and the other end located within the target routing region; the second extension section extends along the column direction, and has one end connected to the first extension section and the other end extending to a region of the transfer layer corresponding to the drive region.

In an exemplary embodiment of the present disclosure, the second extension section of the fourth lead is located in the second sub-region; the second extension section of the fifth lead is located in the third sub-region; and the second extension section of the sixth lead is located in the fourth sub-region.

In an exemplary embodiment of the present disclosure, in the fourth sub-region, the fourth transfer holes are distributed in i rows and j columns, and at most j−1 second extension sections are distributed between the fourth transfer holes of any adjacent two columns; both i and j are positive integers.

In an exemplary embodiment of the present disclosure, the leads at two sides of the first central axis are symmetrical with respect to the first central axis;
the leads at two sides of the third central axis are symmetrical with respect to the third central axis, wherein the third central axis is a central axis of the light transmitting region along the row direction.

In an exemplary embodiment of the present disclosure, the first lead layer is provided on a surface of the drive back plate close to the light emitting layer;
the transfer layer further includes:
a first flat layer, covering the first lead layer and a surface of the drive back plate close to the light emitting layer, wherein the second lead layer is provided on a surface of the first flat layer away from the drive back plate;
a second flat layer, covering the second lead layer and a surface of the first flat layer close to the light emitting layer, wherein the third lead layer is provided on a surface of the second flat layer away from the drive back plate;
a third flat layer, covering the third lead layer and a surface of the second flat layer close to the light emitting layer, wherein the light emitting layer is provided on a surface of the third flat layer away from the drive back plate.

In an exemplary embodiment of the present disclosure, a density of the first light emitting device in the light transmitting region is the same as a density of the second light emitting device in the drive region.

In an exemplary embodiment of the present disclosure, the drive region includes:
a pixel region, at least partially surrounding outside the light transmitting region, wherein one side of the light transmitting region coincides with one side of the pixel region;
a frame region, surrounding outside the pixel region,
wherein at least a portion of the first pixel circuits is distributed in the pixel region, and at most a portion of the first pixel circuits is distributed in the frame region.

According to an aspect of the present disclosure, there is provided a method of manufacturing a display panel, including:
forming a drive back plate, wherein the drive back plate has a light transmitting region and a drive region at least partially surrounding the light transmitting region, wherein the drive region has a plurality of pixel circuits and at least includes first pixel circuits and second pixel circuits;
forming a transfer layer on a side of the drive back plate, wherein the transfer layer includes a plurality of layers of mutually insulated lead layers, each of the lead layers includes a plurality of mutually insulated leads; each lead extends from the light transmitting region to the drive region and is connected to one of the first pixel circuits; and
forming a light emitting layer on a surface of the transfer layer away from the drive back plate, wherein the light emitting layer includes a plurality of light emitting devices, the light emitting device includes a plurality of first light emitting devices located in the light transmitting region and a plurality of second light emitting devices located in the drive region; the first light emitting devices are connected to the first pixel circuits in a one-to-one correspondence through the leads in each lead layer; and the second pixel circuits are connected to the second light emitting devices in a one-to-one correspondence.

According to an aspect of the present disclosure, there is provided a display apparatus, including the display panel according to any one of the above.

According to an aspect of the present disclosure, there is provided a terminal device, including:

the display panel according to any of the above; and an imaging apparatus, provided on a backlight side of the display panel and provided directly opposite to the light transmitting region, for capturing an image through the light transmitting region.

It should be understood that the above general description and the following detailed description are only exemplary and explanatory, and do not limit the present disclosure.

BRIEF DESCRIPTION OF THE DRAWINGS

The accompanying drawings herein are incorporated into the specification and constitute a part of the present specification, showing the embodiments of the present disclosure, and explain the principles of the present disclosure together with the specification. It will be apparent that the drawings in the following description are merely some embodiments of the present disclosure, and those skilled in the art will also obtain other drawings according to these drawings without paying creative labor.

DETAILED DESCRIPTION

Figure 1:
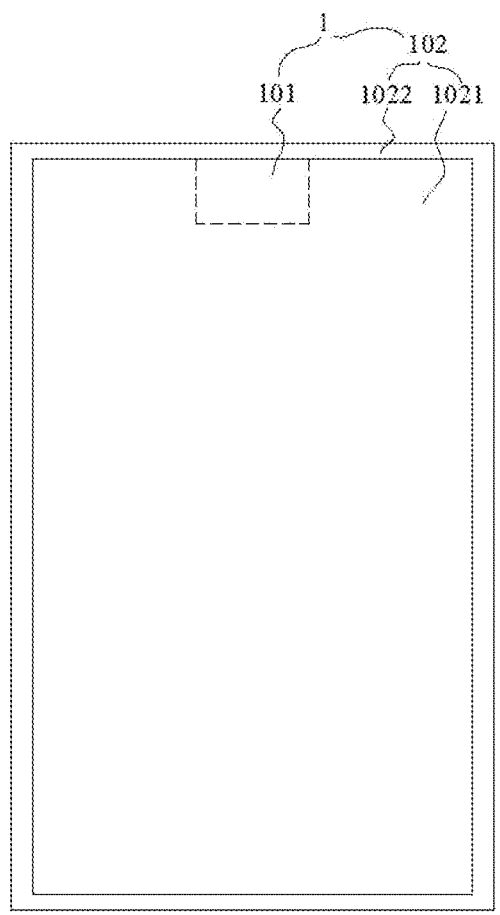
FIG. 1 is a schematic diagram of a drive back plate in an embodiment of the display panel of the present disclosure.

Example embodiments will now be described more fully with reference to the drawings. However, the example embodiments can be implemented in various forms, and should not be construed as being limited to the examples set forth herein. On the contrary, these embodiments are provided to make the present disclosure more comprehensive and complete, and fully convey the idea of the example embodiments to those skilled in the art. The same reference numerals in the drawings indicate the same or similar structure, and thus the detailed description thereof will be omitted. Further, the drawings are only schematic illustrations of the present disclosure, and it is not necessarily drawn to scale.

The terms "one", "a", "this", "said", and "at least one" are used to indicate the presence of one or more elements/components/etc.; the terms "including" and "having" are used to indicate open-ended inclusive meaning and means that in addition to the listed elements/components/etc., there may be other elements/components/etc.; the terms "first", "second", "third", etc. are only used as a mark, not a limitation to the number of objects.

The row direction and column direction are only two vertical directions, and the specific direction is not limited. For example, the row direction may be the horizontal X direction in FIGS. 8-13, and the column direction may be the longitudinal Y direction in FIGS. 8-13. Those skilled in the art can know that if the display panel rotates, the actual orientation of the row direction and the column direction may change.

A listing of the reference numerals is as follows: 1, drive back plate; 101, light transmitting region; 102, drive region; 1021, pixel region; 1022, frame region; 10, pixel circuit; 110, first pixel circuit; 120, second pixel circuit; 2, transfer layer; 20, routing region; 20a, target routing region; 2011, first sub-region; 2012, second sub-region; 2013, third sub-region; 2014, fourth sub-region; 2014a, first secondary sub-region; 2014b, second secondary sub-region; 21, lead layer; 211, lead; 21a, first lead layer; 211a, first lead; 21b, second lead layer; 211b, second lead; 21c, third lead layer; 211c, third lead; 211d, fourth lead; 211e, fifth lead; 211f, sixth lead; 201, transfer hole; 201a, first transfer hole; 201b, second transfer hole; 201c, third transfer hole; 201d, fourth transfer hole; 210, lead-out section; 220, extension section; 2201, first extension section; 2202, second extension section; 22, first flat layer; 23, second flat layer; 24, third flat layer; 3, light emitting layer; 30, light emitting device; 301, first light emitting device; 302, second light emitting device; 311, first electrode; 3111, electrode portion; 3112, wiring portion; 312, light emitting function layer; 313, second electrode; 314, pixel definition layer; 301, first light emitting device; 302, second light emitting device; 100, display panel; and 200, imaging apparatus.

Figure 2:
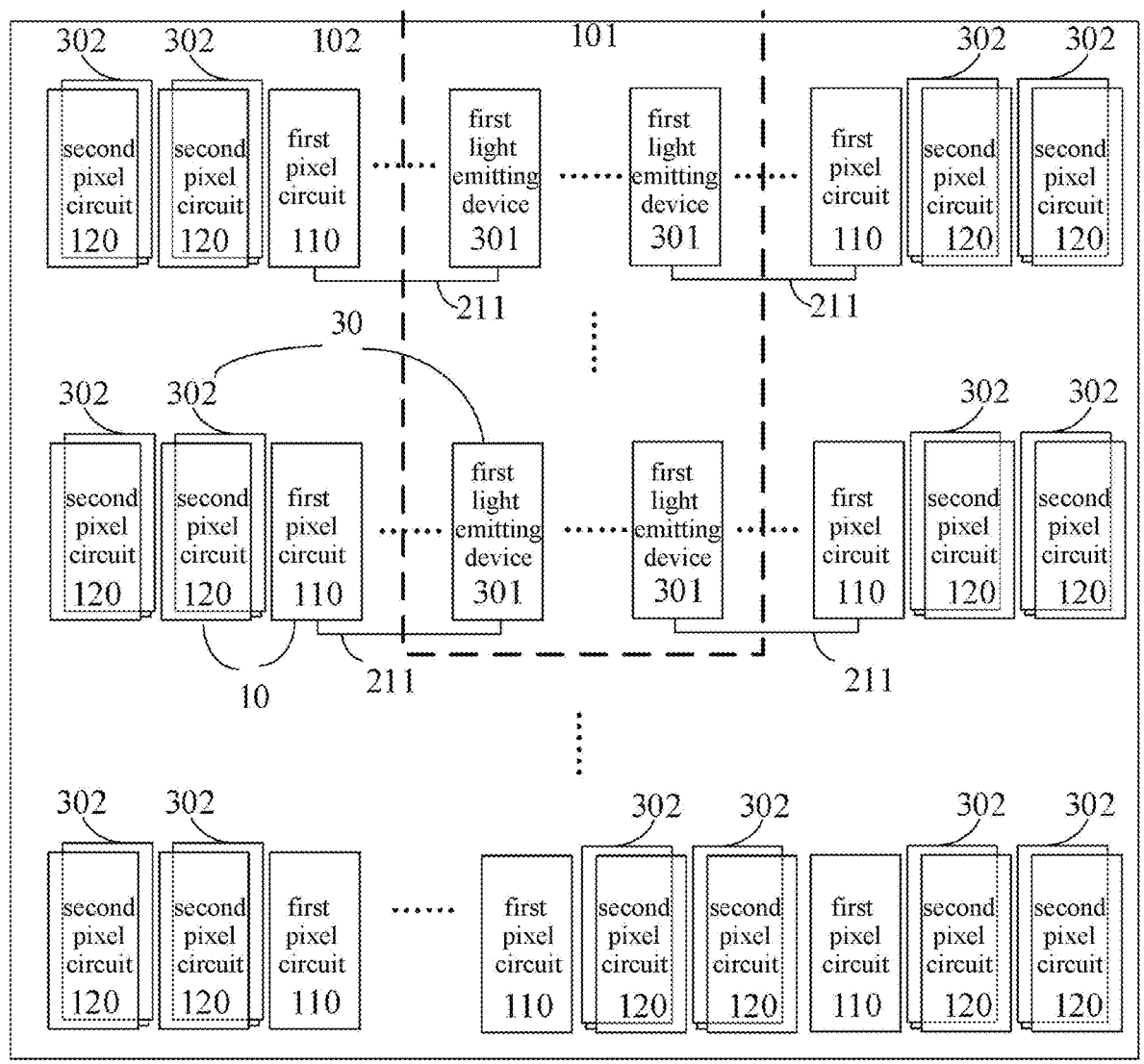
FIG. 2 is a schematic diagram of connection of a pixel circuit and a light emitting device in an embodiment of the display panel of the present disclosure.
Figure 5:
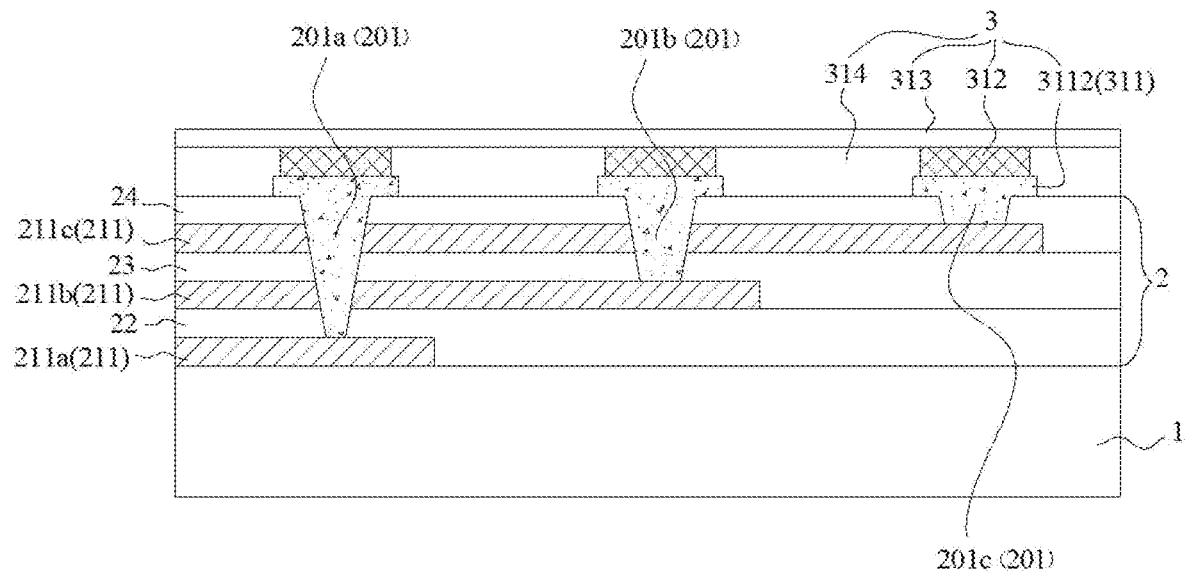
FIG. 5 is a schematic cross-sectional view of a display panel in an embodiment of the display panel of the present disclosure.

The embodiment of the present disclosure provides a display panel, which may be an organic light-emitting diode (OLED) display panel. As shown in FIGS. 1, 2, and 5, the display panel includes a drive back plate 1, a transfer layer 2, and a light emitting layer 3.

The drive back plate 1 has a light transmitting region 101 and a drive region 102 at least partially surrounding the light transmitting region 101. The drive region 102 has a plurality of pixel circuits 10 and at least includes first pixel circuits 110 and second pixel circuits 120.

The transfer layer 2 is provided on a side of the drive back plate 1 and includes a plurality of layers of mutually insulated lead layers 21. Each of the lead layers 21 includes a plurality of mutually insulated leads 211. Each lead 211 extends from the light transmitting region 101 to the drive region 102 and is connected to one of the first pixel circuits 110.

The light emitting layer 3 is provided on a side of the transfer layer 2 away from the drive back plate 1 and includes a plurality of light emitting devices 30. The light emitting device 30 includes a plurality of first light emitting devices 301 located in the light transmitting region 101 and a plurality of second light emitting devices 302 located in the drive region 102.

The first light emitting devices 301 are connected to the first pixel circuits 110 in a one-to-one correspondence through the leads 211 in each lead layer 21, and the second pixel circuits 120 are connected to the second light emitting devices 302 in a one-to-one correspondence.

In the display panel of the present disclosure, the first pixel circuit 110 for driving the first light emitting device 301 of the light transmitting region 101 is disposed in the drive region 102 outside the light transmitting region 101, which may increase the transparency of the light transmitting region 101 without reducing the number of light emitting devices 30, which is convenient for the imaging apparatus to capture images. At the same time, the first light emitting device 301 of the light transmitting region 101 is connected to the first pixel circuit 110 through the leads 211 of a plurality of layers of lead layers 21, such that the light transmitting region 101 can display images normally. In any event, the plurality of lead layers 21 may increase the layout space of the leads 211. When there are many first light emitting devices 301 in the light transmitting region 101, each first light emitting device 301 can still be connected to the first pixel circuit 110 to avoid the reduction of the number of first light emitting devices 301 due to the inability to provide sufficient leads 211. In addition, the second light emitting device 302 is connected to the second pixel circuit 120 and images can be displayed outside the light transmitting region 101.

The following describes the parts of the display panel.

As shown in FIG. 1, the drive back plate 1 is provided with a pixel circuit 10 for driving the light emitting device 30 to emit light, and the drive back plate 1 at least includes the light transmitting region 101 and the drive region 102. The pixel circuit 10 is located in the drive region 102. The pixel circuit 10 is not provided in the light transmitting region 101, notably, to increase transparency, and the imaging apparatus can take an image through the light transmitting region 101, thereby implementing the camera shooting under the screen.

As shown in FIG. 2, the pixel circuit 10 in the drive region 102 at least includes the first pixel circuit 110 and the second pixel circuit 120. The first pixel circuit 110 is used to drive a light emitting device corresponding to the light transmitting region 101, e.g., the first light emitting device 301. The second pixel circuit 120 is used to drive the light emitting device corresponding to the drive region 102, e.g., the second light emitting device 302.

In some embodiments of the present disclosure, as shown in FIGS. 1 and 2, the drive region 102 can include a pixel region 1021 and a frame region 1022. The pixel region 1021 at least partially surrounds outside the light transmitting region 101, and one side of the light transmitting region 101 may at least partially coincide with one side of the pixel region 1021. The frame region 1022 may surround outside the pixel region 1021, and a peripheral circuit for inputting a drive signal to the pixel circuit 10 can be provided within the frame region 1022. The peripheral circuit may include a gate drive circuit, a light emitting control circuit, and the like, which is not specially limited herein. The pixel region 1021 can also completely surround the light transmitting region 101.

Further, the first pixel circuits 110 can be all distributed in the pixel region 1021, and all the second pixel circuits 120 are also distributed within the pixel region 1021. Alternatively, a portion of the first pixel circuits 110 can be disposed within the pixel region 1021, and all the second pixel circuits 120 can be also distributed within the pixel region 1021, and other first pixel circuits 110 are disposed within the frame region 1022. Additionally, all of the first pixel circuits 110 can be disposed within the frame region 1022.

Further, the first pixel circuits 110 and the second pixel circuits 120 in the pixel region 1021 are distributed in an array. Each column of first pixel circuits 110 is located between each column of second pixel circuits 120, and a column of first pixel circuits 110 is provided between two adjacent columns of second pixel circuits 120. A plurality of columns of second pixel circuits 120 may be provided between two adjacent columns of first pixel circuits 110.

Further, one column or multi-column of pixel circuits 10 nearest to the light transmitting region 101 in the row direction may not be connected to the first light emitting device 301 and the second light emitting device 302, and these pixel circuits 10 are used as the dummy pixel circuits (not shown in the figure), in order to increase the distance to the transmitting region 101 from the second pixel circuit 120 connected to the first light emitting device 301 and closest to the light transmitting region 101, increase the minimum length of the corresponding lead 211, to avoid the difference of the turn-on time of the first light emitting devices 301 in different columns too large due to the excessive difference in the length of the leads 211, and the picture quality is improved.

In order to make the drive region 102 have sufficient space to accommodate the first pixel circuits 110 and the second pixel circuits 120 without reducing the number of the pixel circuits 10, each pixel circuit 10 can be compressed along the row direction. Under the premise that the sizes of the drive back plates 1 are the same, by reducing the width of the pixel circuit 10 in the row direction, there will be more regions within the drive region 102, and the second pixel circuits 120 may be provided at these regions. The width of the pixel circuit 10 refers to the length of the orthographic projection of the pixel circuit 10 on the drive back plate 1 along the row direction.

The structure of the pixel circuit 10 is exemplified in the following.

Figure 3:
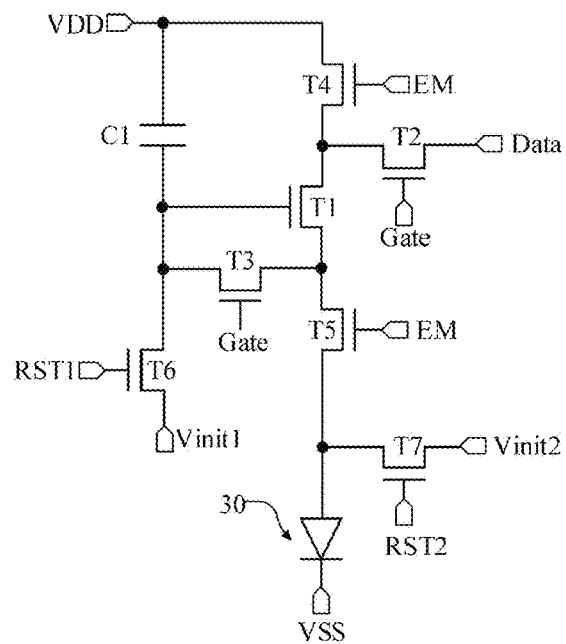
FIG. 3 is an equivalent circuit diagram of a pixel circuit in an embodiment of the display panel of the present disclosure.
Figure 4:
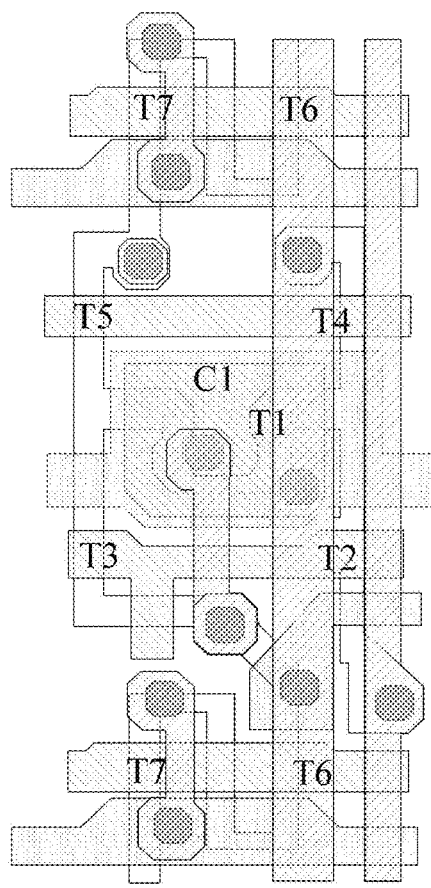
FIG. 4 is a schematic structural diagram of a pixel circuit in an embodiment of the display panel of the present disclosure.

In some embodiments of the present disclosure, as shown in FIGS. 3 and 4, the pixel circuit 10 (the first pixel circuit 110 and the second pixel circuit 120) may be a 7T1C structure, i.e., including 7 transistors and 1 capacitor. The 7T1C pixel circuit includes a drive transistor T1, a data write transistor T2, a threshold compensation transistor T3, a first light emitting control transistor T4, a second light emitting control transistor T5, a first reset transistor T6, a second reset transistor T7, and a storage capacitor C1. The pixel circuit can be connected to a gate signal terminal Gate, a data signal terminal Data, reset signal terminals RST1 and RST2, a light emitting control signal terminal EM, a power supply terminal VDD, initial power supply terminals Vinit1 and Vinit 2, and the light emitting device. The light emitting device can also be connected to the power supply terminal VSS. The pixel circuit 10 can be used to drive the connected light emitting device 30 to emit light in response to signals provided by the connected signal terminals.

In addition, the transistors can be divided into N-type and P-type transistors according to the characteristic of the transistor. The embodiments of the present disclosure takes the transistors as the P-type transistors as an example. Based on the description and teaching of the implementation in the present disclosure, those of ordinary skill in the art can easily conceive that at least part of the transistors in the pixel circuit structure of the embodiments of the present disclosure are N-type transistors without creative work, that is, using the implementation manners of the N-type transistors or the combination of the N-type transistors and the P-type transistors. Therefore, these implementation manners are also within the protection scope of the embodiments of the present disclosure.

In other embodiments of the present disclosure, the pixel circuit 10 may also employ other structures, as long as it can drive the light emitting device 30 to emit light, which is not particularly limited herein.

Based on the above-described pixel circuit 10, the structure of a transistor is taken as an example, the drive back plate 1 may include an active layer, a first gate insulating layer, a gate electrode, a second gate insulating layer, a dielectric layer, a first source-drain layer, a first planarization layer, a second source-drain layer and a second planarization layer sequentially stacked on the substrate, to form a transistor. The specific structure of the transistor is not particularly limited herein.

As shown in FIG. 5, the transfer layer 2 is provided on a side of the drive back plate 1. For example, the transfer layer 2 is provided on a surface of the second planarization layer away from the substrate. The transfer layer 2 can cover the light transmitting region 101 and the drive region 102, and the transfer layer 2 includes a plurality of layers of mutually insulated lead layers 21. Each of the lead layers 21 includes a plurality of mutually insulated leads 211. Each lead 211 extends from the light transmitting region 101 to the drive region 102 and is connected to one of the first pixel circuits 110. That is, each lead 211 is only used to transmit signals from one first pixel circuit 110. At the same time, the transfer layer 2 is provided with transfer holes 201 connected to each lead 211 in one-to-one correspondence. Any of the first light emitting devices 301 can be connected to the corresponding first pixel circuit 110 through a transfer hole 201 and the lead 211. The transfer hole 201 may be a via hole structure in the transfer layer 2, but since the leads 211 connected to the transfer hole 201 may be located in different lead layers 21, the depth of different transfer holes 201 may be different.

The material of the lead 211 of each lead layer 21 may be a transparent material such as indium tin oxide (ITO) or indium gallium zinc oxide (IGZO).

In some embodiments of the present disclosure, as shown in FIG. 5, the number of lead layers 21 may be three layers, including a first lead layer 21a, a second lead layer 21b, and a third lead layer 21c that are sequentially distributed from the drive back plate 1 to the light emitting layer 3. The leads 211 of the first lead layer 21a include first leads 211a, the leads 211 of the second lead layer 21b include second leads 211b, and the leads 211 of the third lead layer 21c include third leads 211c.

It should be noted that FIG. 5 is only schematically shown for explaining the relationship between the film layers of the display panel, which does not limit the specific structure of the lead layer 21.

As shown in FIG. 5, in order to insulate the lead layers 21, the transfer layer 2 further includes a first flat layer 22, a second flat layer 23, and a third flat layer 24.

The first lead layer 21a can be provided on the surface of the drive back plate 1 close to the light emitting layer 3. The first flat layer 22 covers the surface of the drive back plate 1 close to the light emitting layer 3 and the first lead layer 21a.

The second lead layer 21b is provided on the surface of the first flat layer 22 away from the drive back plate 1. The second flat layer 23 covers the surface of the first flat layer 22 close to the light emitting layer 3 and the second lead layer 21b.

The third lead layer 21c is provided on the surface of the second flat layer 23 away from the drive back plate 1. The third flat layer 24 covers the surface of the second flat layer 23 close to the light emitting layer 3 and the third lead layer 21c. The light emitting layer 3 is provided on the surface of the third flat layer 24 away from the drive back plate 1.

As shown in FIG. 5, the light emitting layer 3 may include a plurality of light emitting devices 30, and each light emitting device 30 may be connected to a first pixel circuit 110 through a lead 211. The light emitting device 30 may be an OLED light emitting device, which may include a first electrode 311, a light emitting function layer 312, and a second electrode 313.

Figure 6:
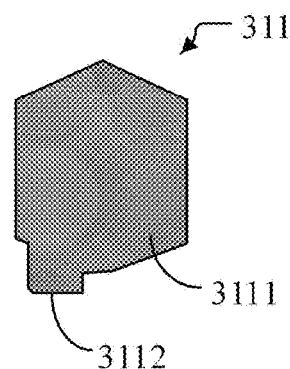
FIG. 6 is a plan view of a first electrode in an embodiment of the display panel of the present disclosure.

The first electrode 311 may be disposed on the surface of the transfer layer 2 away from the drive back plate 1. For example, the first electrode 311 may be disposed on the surface of the third flat layer 24 away from the drive back plate 1. As shown in FIG. 6, the first electrode 311 serves as the anode of the OLED light emitting device and has an electrode portion 3111 and a wiring portion 3112 located outside the edge of the electrode portion 3111. The wiring portion 3112 is connected to the electrode portion 3111 or they are in an integrated structure. The electrode portion 3111 of each first electrode 311 is connected to a lead 211 through the wiring portion 3112 and a transfer hole 201 in the transfer layer 2, thereby connecting the first pixel circuit 110 with the first electrode 311 of the corresponding light emitting device 30.

The light emitting function layer 312 may be provided on the surface of the first electrode 311 away from the drive back plate 1, and may include a hole injection layer, a hole transport layer, an organic light emitting layer, an electron transport layer, and an electron injection layer which are sequentially stacked on the first electrode 311.

The second electrode 313 serves as the cathode of the OLED light emitting device, and may be provided on the surface of the light emitting function layer 312 away from the drive back plate 1. The light emitting function layer 312 can be driven to emit light by applying electrical signals to the first electrode 311 and the second electrode 313.

The above is the structure of one light emitting device 30. In the entire display panel, the first electrode 311 of each light emitting device 30 can be formed of the same material and formed simultaneously through one patterning process. Each light emitting function layer 312 can also be formed of the same material, and formed simultaneously through one patterning process. At the same time, each light emitting device 30 can share the same second electrode 313, that is, the second electrode 313 can cover each light emitting function layer 312 at the same time. In addition, in order to facilitate defining the light emitting range of each light emitting device 30, the light emitting layer 3 may further include a pixel definition layer 314, which may be provided on the surface of the transfer layer 2 away from the drive back plate 1 and have openings exposing each first electrode 311. The light emitting function layer 312 can cover the first electrode 311 in each opening, and expose the electrode portion 3111, and the wiring portion 3112 is located outside the opening.

In order to make the brightness of the region of the light emitting layer 3 corresponding to the light transmitting region 101 and the region corresponding to the drive region 102 consistent, the density of the first light emitting device 301 in the region corresponding to the light transmitting region 101 can be made the same as the density of the second light emitting device 302 in the region corresponding to the drive region 102.

The routing manner of the lead 211 will be described in detail below in conjunction with the specific structure of the transfer layer 2.

Figure 7:
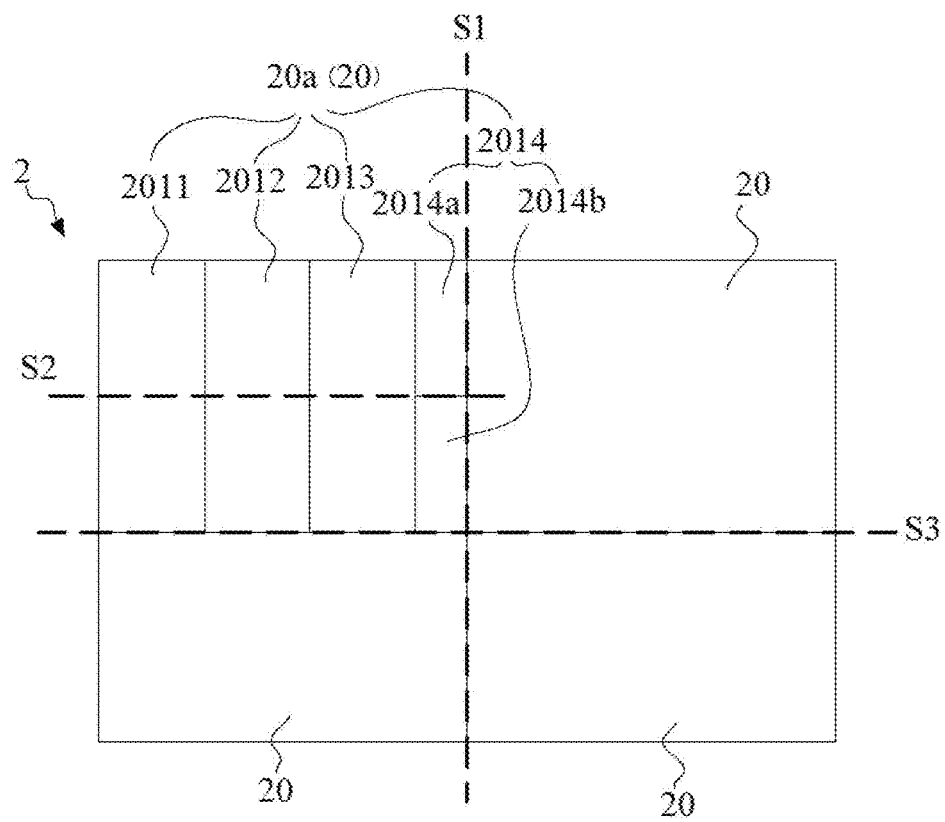
FIG. 7 is a schematic view of each routing region of the transfer layer in an embodiment of the display panel of the present disclosure.

In some embodiments of the present disclosure, as shown in FIG. 7, the region of the transfer layer 2 corresponding to the light transmitting region 101 may be partitioned, to obtain a plurality of routing regions 20. A lead 211 in each routing region 20 is used to connect the light emitting device 30 corresponding to the routing region 20. Specifically, the region of the transfer layer 2 corresponding to the light transmitting region 101 may include a plurality of routing regions 20 distributed in an array, that is, the orthographic projection of each routing region 20 on the drive back plate 1 is located within the light transmitting region 101.

As shown in FIG. 7, the central axis of the light transmitting region 101 along the column direction is taken as the first central axis S1. Each routing region 20 includes a target routing region 20a. The target routing region 20a is located on one side of the first central axis S1, and the target routing region 20a includes a plurality of sub-regions sequentially distributed along the row direction toward the first central axis S1. The sub-regions include a first sub-region 2011, a second sub-region 2012, and a third sub-region 2013. The widths of the first sub-region 2011, the second sub-region 2012 and the third sub-region 2013 in the row direction may be equal.

Figure 8:
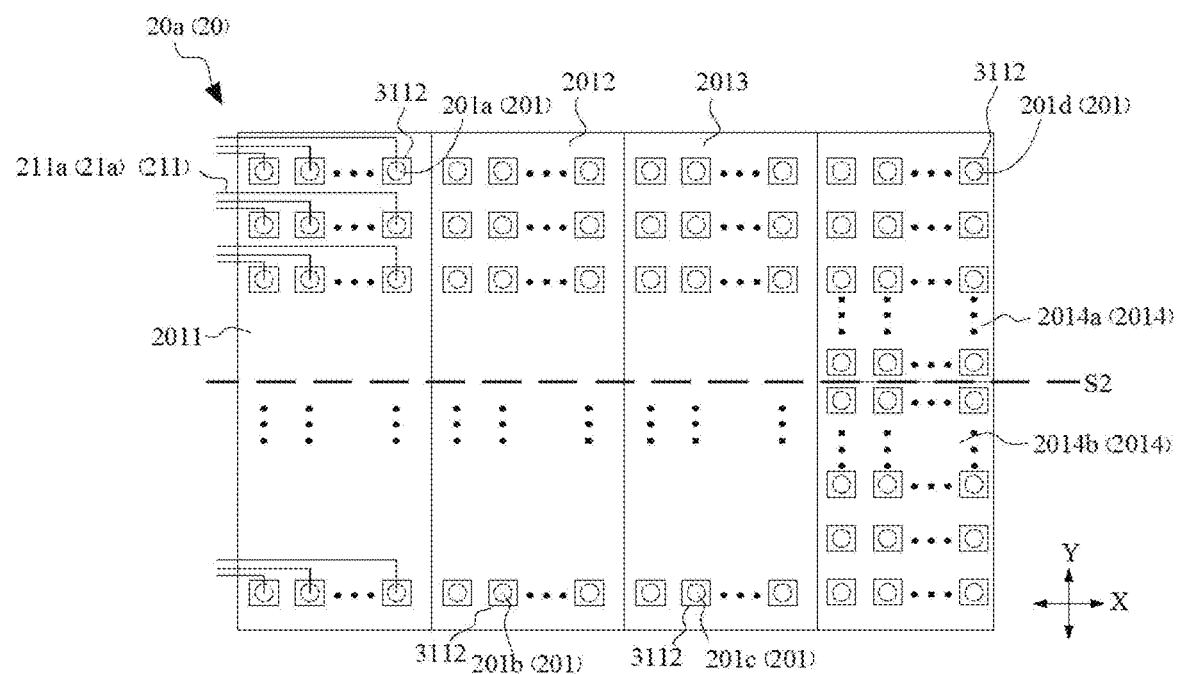
FIG. 8 is a schematic diagram of a first sub-region in an embodiment of the display panel of the present disclosure.
Figure 9:
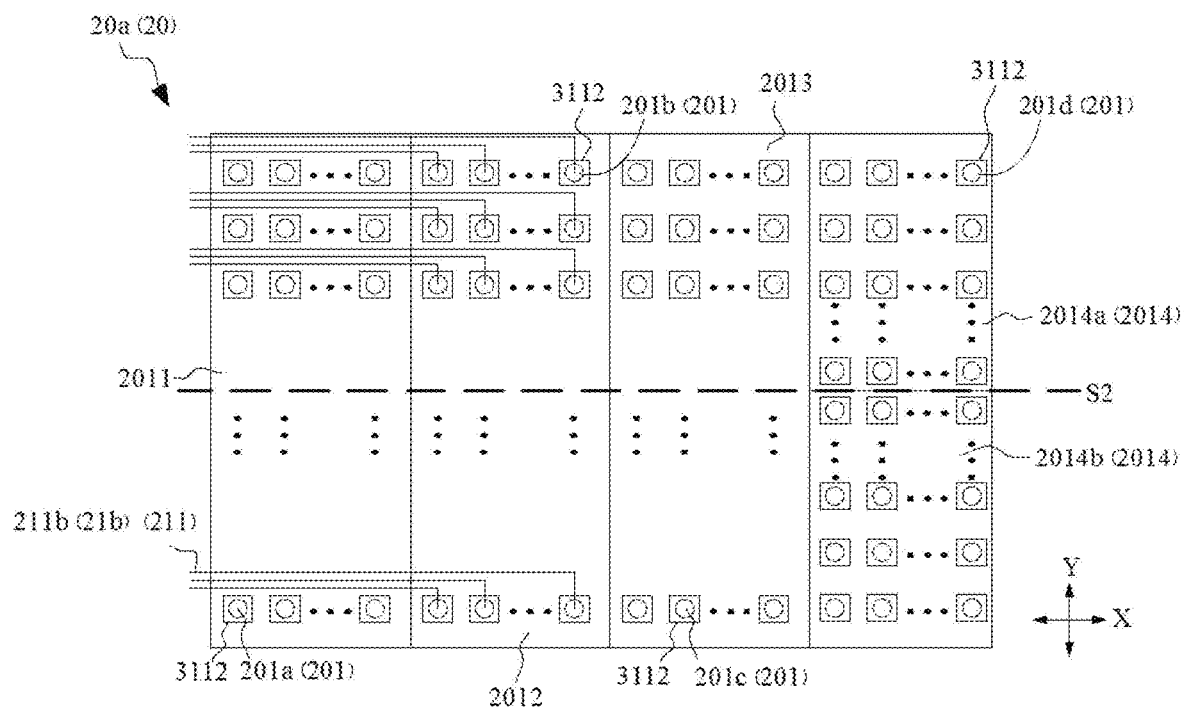
FIG. 9 is a schematic view of a second sub-region in an embodiment of the display panel of the present disclosure.
Figure 10:
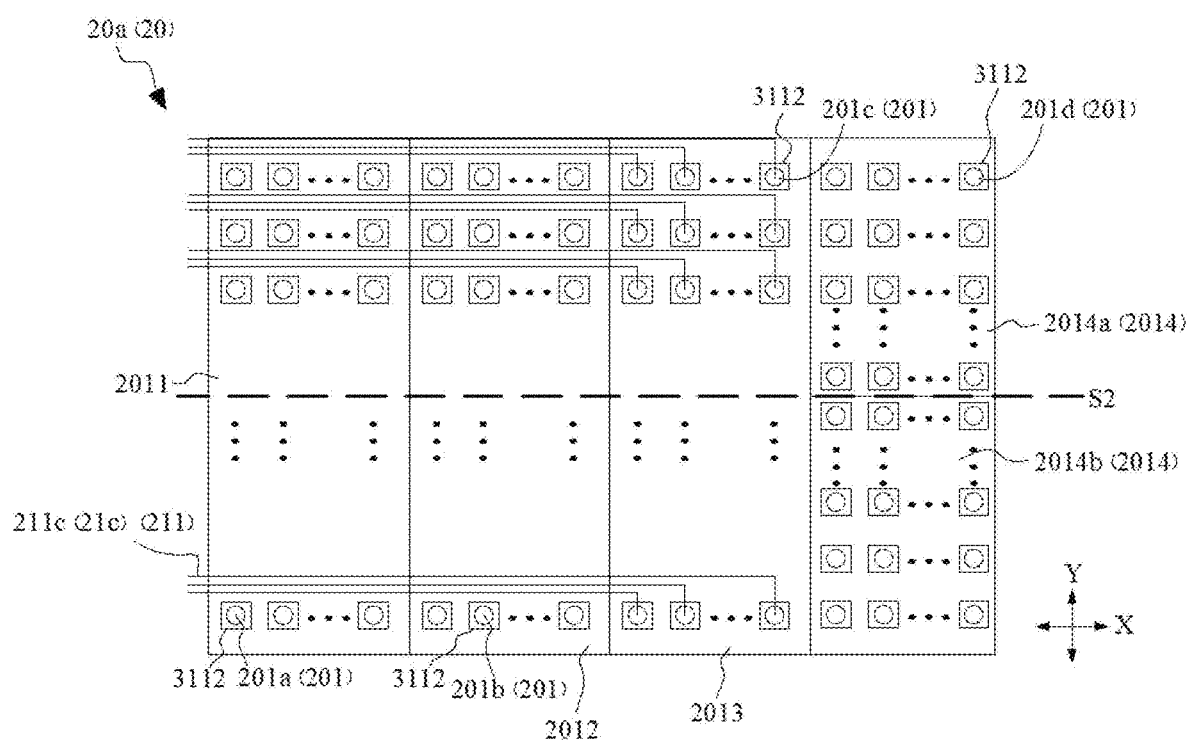
FIG. 10 is a schematic view of a third sub-region in an embodiment of the display panel of the present disclosure.

As shown in FIG. 8, the transfer holes 201 in the first sub-region 2011 are first transfer hole 201a, and each first transfer hole 201a can be connected to a first lead 211a, so the first transfer hole 201a penetrates the first flat layer 22, the second flat layer 23 and the third flat layer 24. As shown in FIG. 9, the transfer holes 201 in the second sub-region 2012 are second transfer holes 201b, and each second transfer hole 201b can be connected to a second lead 211b, so the second transfer hole 201b penetrates the second flat layer 23 and the third flat layer 24. As shown in FIG. 10, the transfer holes 201 in the third sub-region 2013 are third transfer holes 201c, and each third transfer hole 201c can be connected to a third lead 211c, so the third transfer hole 201c penetrates the third flat layer 24. In addition, the first transfer hole 201a, the second transfer hole 201b and the third transfer hole 201c can be respectively connected to the corresponding first light emitting device 301, so as to realize the connection between the lead 211 and the first light emitting device 301.

Meanwhile, as shown in FIGS. 8-10, in the light emitting layer 3, the wiring portion 3112 corresponding to the first sub-region 2011 can be connected to the corresponding first pixel circuit 110 through the first transfer hole 201a and the first lead 211a. The wiring portion 3112 corresponding to the second sub-region 2012 may be connected to the corresponding first pixel circuit 110 through the second transfer hole 201b and the second lead 211b. The wiring portion 3112 corresponding to the third sub-region 2013 may be connected to the corresponding first pixel circuit 110 through the third transfer hole 201c and the third lead 211c.

Further, in the region of the first sub-region 2011, the first transfer holes 201a are distributed in N rows and M columns, and at most M first leads 211a are distributed between any two adjacent rows of the first transfer holes 201a.

In the second sub-region 2012, the second transfer holes 201b are distributed in N rows and M columns, and at most M second leads 211b are distributed between any two adjacent rows of the second transfer holes 201b.

In the third sub-region 2013, the third transfer holes 201c are distributed in N rows and M columns, and at most M third leads 211c are distributed between any two adjacent rows of the third transfer holes 201c.

The foregoing N and M are both positive integers, and their specific values are not specifically limited herein. For example, M can be 13, that is, at most thirteen leads 211 can be distributed between adjacent two rows of the transfer holes 201, and N can be 50, 80, 100 or the like.

Figure 11:
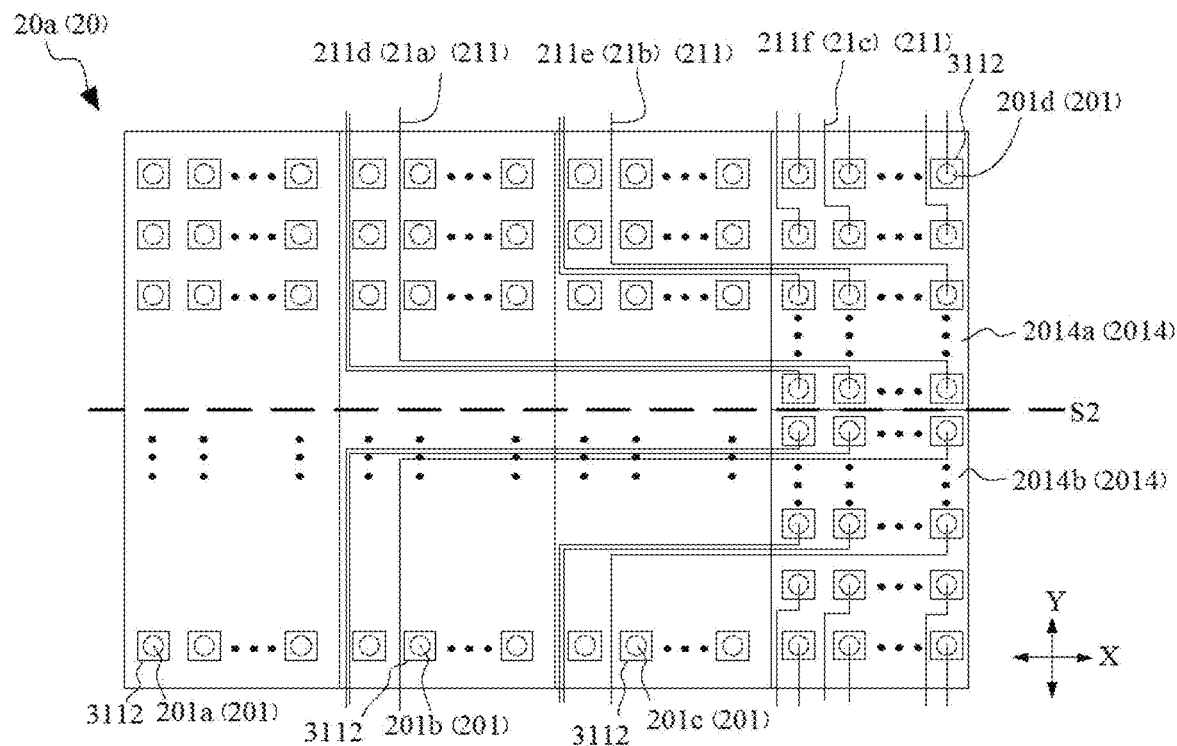
FIG. 11 is a schematic view of leads of the fourth sub-region in an embodiment of the display panel of the present disclosure.
Figure 12:
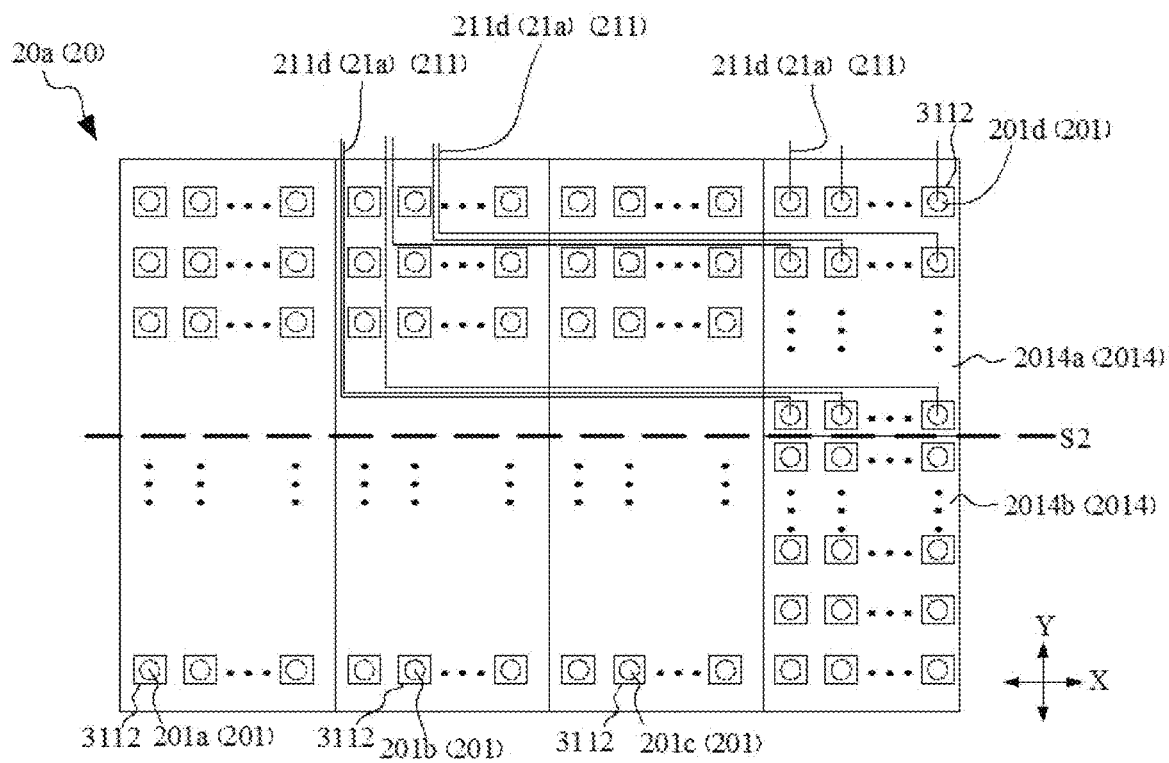
FIG. 12 is a schematic view of leads of the fourth sub-region in another embodiment of the display panel of the present disclosure.
Figure 13:
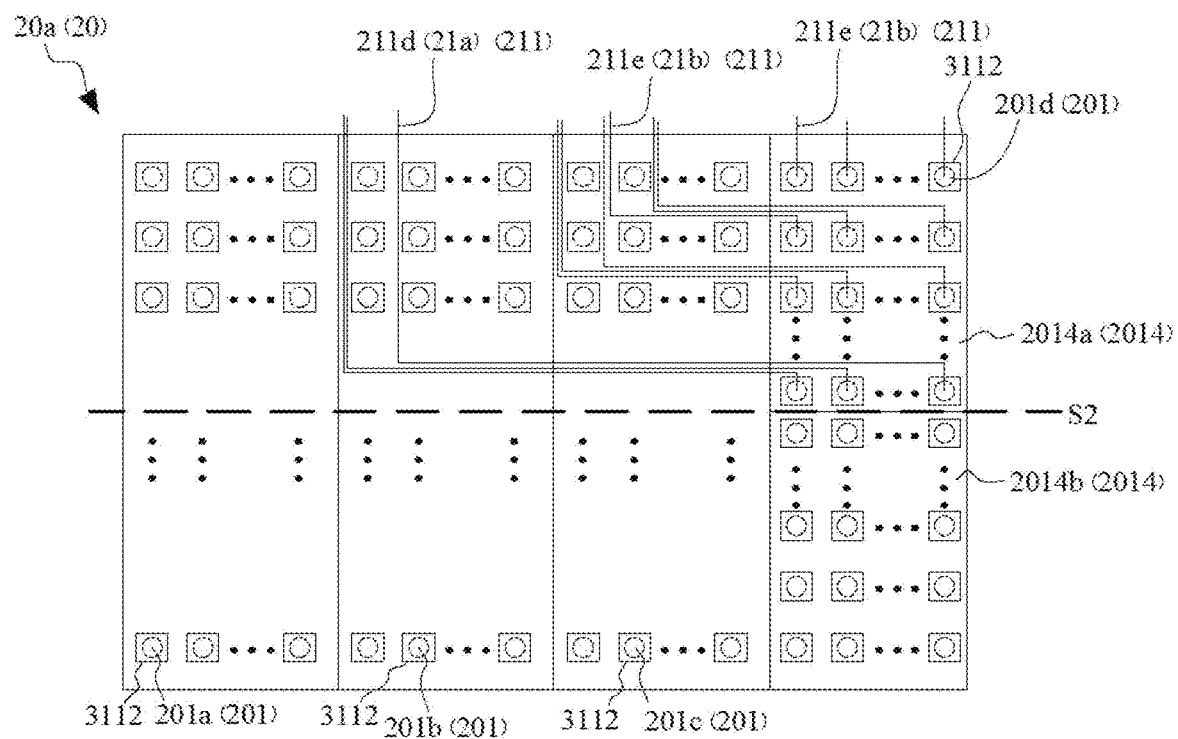
FIG. 13 is a schematic view of leads of the fourth sub-region in yet another embodiment of the display panel of the present disclosure.

Furthermore, as shown in FIGS. 11-13, the target routing region 20a may further include a fourth sub-region 2014, which is located on the side of the third sub-region 2013 away from the first sub-region 2011. The transfer holes 201 in the fourth sub-region 2014 are the fourth transfer holes 201d.

The lead 211 of the first lead layer 21a further includes a fourth lead 211d insulated from the first lead 211a; and at least a portion of the wiring portion 3112 corresponding to the fourth sub-region 2014 is connected to the corresponding first pixel circuit 110 through the fourth transfer hole 201d and the fourth lead 211d. In other words, the first lead layer 21a can be used to connect the first light emitting device 301 corresponding to the first sub-region 2011, and also used to connect the first light emitting device 301 corresponding to the fourth sub-region 2014.

The lead 211 of the second lead layer 21b further includes a fifth lead 211e insulated from the second lead 211b, and at least a portion of the wiring portion 3112 corresponding to the fourth sub-region 2014 is connected to the corresponding first pixel circuit 110 through the fourth transfer hole 201d and the fifth lead 211e. In other words, the second lead layer 21b can be used to connect the light emitting device corresponding to the second sub-region 2012, and also used to connect the light emitting device corresponding to the fourth sub-region 2014.

The lead 211 of the third lead layer 21c further includes a sixth lead 211f insulated from the third lead 211c, and at least a portion of the wiring portion 3112 corresponding to the fourth sub-region 2014 is connected to the corresponding first pixel circuit 110 through the fourth transfer hole 201d and the sixth lead 211f In other words, the third lead layer 21c can be used to connect the light emitting device corresponding to the third sub-region 2013, and also used to connect the light emitting device corresponding to the fourth sub-region 2014.

As shown in FIGS. 11-13, in order to facilitate the routing, the fourth sub-region 2014 may be divided into a plurality of secondary sub-regions. For example, the fourth sub-region 2014 includes a first secondary sub-region 2014a and a second secondary sub-region 2014b. The first secondary sub-region 2014a and the second secondary sub-region 2014b are symmetrical with respect to a second central axis S2. The second central axis S2 is a central axis of the target routing region 20a along the row direction. The lead 211 corresponding to the first secondary sub-region region 2014a and the lead 211 corresponding to the second secondary sub-region 2014b may be symmetrical with respect to the second central axis S2.

The structure of the lead 211 is described below.

In some embodiments of the present disclosure, as shown in FIG. 11, the fourth transfer holes 201d of the first secondary sub-region 2014a are connected to the corresponding first pixel circuit 110 in the drive region 102 through the fourth leads 211d, the fifth leads 211e, and the sixth leads 211f respectively. All the sixth leads 211f can be divided into a first group and a second group. The sixth leads 211f of the first group can be connected to the row of fourth transfer holes 201d closest to the edge of the display panel in the first secondary sub-region 2014a. The number of first group of sixth leads 211f is equal to the number of columns of fourth transfer holes 201d in the first secondary sub-region 2014a. The first group of sixth leads 211f can extend in the column direction to the frame region 1022. If the corresponding first pixel circuit 110 is located in the frame region 1022, the first group of sixth leads 211f can be connected to the corresponding first pixel circuit 110 in the frame region 1022. If no first pixel circuit 110 is provided in the frame region 1022, the first group of sixth leads 211f can pass through the frame region 1022 by other routing and then be connected to the first pixel circuit 110 in the pixel region 1021.

Figure 14:
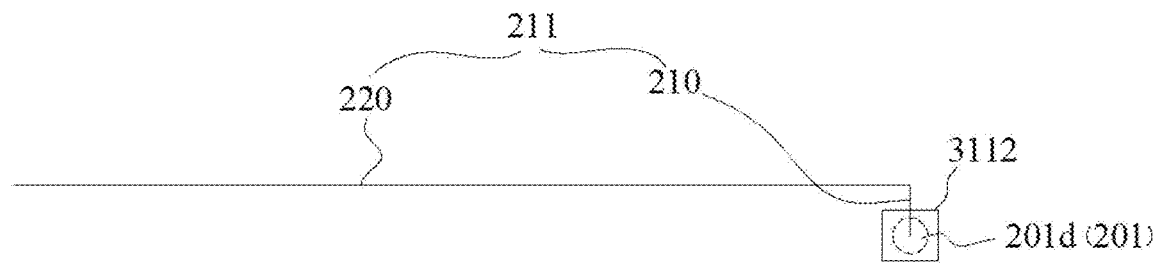
FIG. 14 is a schematic view of leads in an embodiment of the display panel of the present disclosure.
Figure 15:
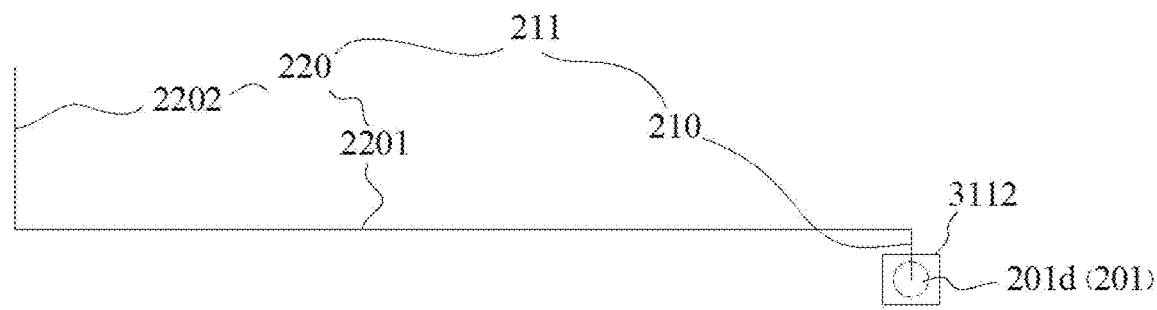
FIG. 15 is a schematic view of another leads in an embodiment of the display panel of the present disclosure.

As shown in FIGS. 11, 14 and 15, the first lead 211a to the fifth lead 211e and the second group of the sixth leads 211f include a lead-out section 210 and an extension section 220.

The lead-out section 210 may extend along the column direction and be connected to the transfer hole 210. For example, the lead-out section 210 of the first lead 211a may be connected to the first transfer hole 201a; the lead-out section 210 of the second lead 211b may be connected to the second transfer hole 201a; the lead-out section 210 of the third lead 211c may be connected to the third transfer hole 201c. The lead-out sections 210 of the fourth lead 211d, the fifth lead 211e and the sixth lead 211f can be connected to the fourth transfer hole 201d, but fourth transfer holes 201d connected to the lead-out sections 210 of the fourth lead 211d, the fifth lead 211e and the sixth lead 211f are different.

One end of the extension section 220 is connected to the lead-out section 210 and the other end of the extension section 220 extends to the region of the transfer layer 2 corresponding to the drive region 102, so as to be connected to the first pixel circuit 110.

The extension section 220 of the first lead 211a, the second lead 211b, and the third lead 211c may extend in the row direction. The extension section 220 of the fourth lead 211d, the fifth lead 211e and the second group of the sixth leads 211f includes at least two sections, namely a first extension section 2201 and a second extension section 2202.

The first extension section 2201 can extend along the row direction, and one end thereof is connected with the lead-out section 210.

The second extension section 2202 can extend along the column direction, and one end thereof is connected to the first extension section 2201, and the other end thereof extends into the region of the transfer layer 2 corresponding to the drive region 102, so as to be connected to the first pixel circuit 110. The second extension section 2202 may be directly connected to the first pixel circuit 110, or may also be connected thereto through other extension lines.

The second extension section 2202 of the fourth lead 211d is located in the second sub-region 2012, to avoid contacting with the first lead 211a. The second extension section 2202 of the fifth lead 211e is located in the third sub-region 2013, to avoid contacting with the second lead 211b. The second extension section 2202 of the second group of sixth leads 211f is located in the fourth sub-region 2014, to avoid contacting with the third lead 211c.

The second extension section 2202 extends in the column direction from the space between the fourth transfer holes 201d. In the fourth sub-region 2014, the fourth transfer holes 201d are distributed in i rows and j columns, and at most j−1 second extension sections 2202 are distributed between the fourth transfer holes 201d of any adjacent two columns. Both i and j are positive integers, and their specific values are not particularly limited herein. For example, j can be 5, that is, at most four second extension sections 2202 can be distributed between transfer holes 201 of adjacent two columns, and i can be 50, 80, 100, etc., which can be equal to N described above. More or fewer second extension sections 2202 can also be provided between adjacent two columns of the transfer holes 201.

In addition, in order to avoid the crossing of the leads 211, as for the first lead 211a, the second lead 211b, and the third lead 211c, the lengths of the lead-out sections 210 connected to the transfer holes 201 of the same row are different, and the length gradually increases toward the first central axis S1, each extension section 220 is respectively connected with each lead-out section 210, so that each extension section 220 is distributed in parallel between transfer holes 201 of adjacent two rows. As for the fourth lead 211d and the fifth lead 211e, the lengths of the lead-out sections 210 connected to the transfer holes 201 of the same row are different, and the length gradually increases toward the first central axis S1, each first extension section 2201 is respectively connected to each lead-out section 210, so that each first extension section 2201 is distributed in parallel between transfer holes 201 of adjacent two rows. The lengths of the lead-out sections 210 connected to the transfer holes 201 of the same row of in the second group of sixth leads 211f can be the same, and the lengths of the first extension sections 2201 can also be the same, so as to be connected to the corresponding first pixel circuit 110 in the frame region 1022 or the pixel region 1021.

In another embodiment of the present disclosure, as shown in FIG. 12, the fourth transfer hole 201d in the first secondary sub-region 2014a may be connected to the corresponding first pixel circuit 110 only through the fourth leads 211d, without providing the fifth lead 211e and the sixth lead 211f. The fourth leads 211d can be divided into a first group and a second group. The fourth leads 211d of the first group are connected to a row of fourth transfer holes 201d connected to the sixth leads 211f of the first group described above, and extend along the column direction. The structure of the fourth leads 211e of the second group can refer to the fourth leads 211d and the fifth leads 211e of the second group described above, which will not be repeated herein.

In still another embodiment of the present disclosure, as shown in FIG. 13, the fourth transfer hole 201d in the second secondary sub-region 2014a may be connected to the corresponding first pixel circuit 110 only through the fourth leads 211d and the fifth leads 211e, without providing the sixth lead 211f. The fifth leads 211d can be divided into a first group and a second group. The fifth leads 211e of the first group are connected to a row of fourth transfer holes 201d connected to the sixth leads 211f of the first group described above, and extend along the column direction. The structure of the fourth leads 211e and the fifth leads 211e of the second group can refer to the fourth leads 211d and the fifth leads 211e of the second group described above, which will not be repeated herein.

Further, in the light transmitting region 101, the leads 211 at two sides of the first central axis S1 may be symmetrical with respect to the first central axis S1. The leads 211 at two sides of the third central axis may be symmetrical with respect to the third central axis S3, wherein the third central axis S3 is a central axis of the light transmitting region 101 along the row direction. Correspondingly, the routing region 20 of the transfer layer 2 is also symmetrically distributed about the first central axis S1 and the third central axis S3, and the light emitting devices 30 are also symmetrically distributed about the first central axis S1 and the third central axis S3.

It should be noted that FIGS. 8-13 are only schematically shown for explaining the path of the leads 211, and do not constitute a limitation on the specific structure of the elements such as the lead 211 and the wiring portion 3112.

Figure 16:
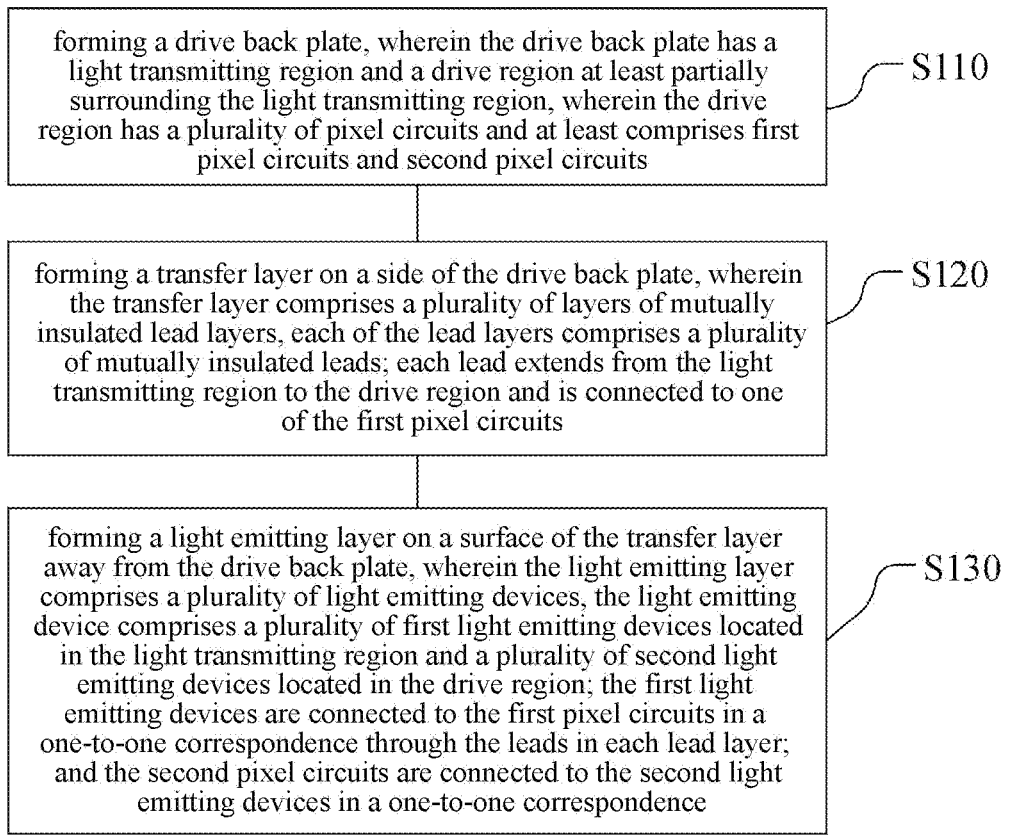
FIG. 16 is a flow chart of an embodiment of the manufacturing method of the present disclosure.

The embodiments of the present disclosure provide a method for manufacturing a display panel. The display panel may be the display panel of any of the above-mentioned embodiments, and its structure will not be described in detail herein. As shown in FIG. 16, the manufacturing method may include step S110-step S130, wherein:

step S110, forming a drive back plate, wherein the drive back plate has a light transmitting region and a drive region at least partially surrounding the light transmitting region, wherein the drive region has a plurality of pixel circuits and at least includes first pixel circuits and second pixel circuits;

step S120, forming a transfer layer on a side of the drive back plate, wherein the transfer layer includes a plurality of layers of mutually insulated lead layers, each of the lead layers includes a plurality of mutually insulated leads; each lead extends from the light transmitting region to the drive region and is connected to one of the first pixel circuits; and step S130, forming a light emitting layer on a surface of the transfer layer away from the drive back plate, wherein the light emitting layer includes a plurality of light emitting devices, the light emitting device includes a plurality of first light emitting devices located in the light transmitting region and a plurality of second light emitting devices located in the drive region; the first light emitting devices are connected to the first pixel circuits in a one-to-one correspondence through the leads in each lead layer; and the second pixel circuits are connected to the second light emitting devices in a one-to-one correspondence.

It should be noted that although the various steps of the manufacturing method in the present disclosure are described in a specific order in the drawings, this does not require or imply that these steps must be performed in the specific order, or that all the steps shown must be performed to achieve the desired result. Additionally or alternatively, some steps may be omitted, multiple steps may be combined into one step for execution, and/or one step may be decomposed into multiple steps for execution, or the like.

The embodiments of the present disclosure provide a display apparatus, which may include the display panel of any of the above-mentioned embodiments, and the structure and the beneficial effects can refer to the above-mentioned display panel embodiments, which will not be repeated herein.

Figure 17:
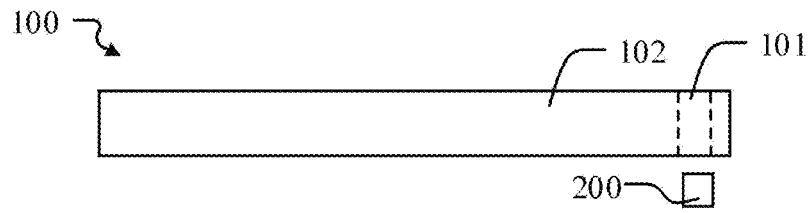
FIG. 17 is a schematic view of an embodiment of the display apparatus of the present disclosure.

The embodiment of the present disclosure further provides a terminal device. As shown in FIG. 17, the terminal device may include a display panel 100 and an imaging apparatus 200.

The display panel 100 may be the display panel of any of the above-mentioned embodiments, and the structure and the beneficial effects can refer to the above-mentioned display panel embodiments, which will not be repeated herein.

The imaging apparatus 200 can be arranged on the backlight side of the display panel 100, i.e., the back side of the orientation of emitting the light. For example, the OLED light emitting device of the display panel 100 has a top-emission structure, that is, emits light in a direction away from the drive back plate, the imaging apparatus 200 can be arranged on the side of the drive back plate 1 away from the light emitting function layer 312, and the imaging apparatus 200 can be directly opposite to the light transmitting region 101, for capturing images through the light transmitting region 101. If the OLED light emitting device of the display panel 100 is a bottom emission structure, the imaging apparatus 200 can be arranged on the side of the light emitting function layer 312 away from the drive back plate 1. The imaging apparatus 200 may include a lens, a photoelectric sensor, etc., and the specific structure of the imaging apparatus 200 is not specifically limited herein, as long as it can capture images.

The terminal device of the present disclosure may be an electronic device with display and shooting functions, such as a mobile phone, a tablet computer, a TV, etc., which will not be listed herein.

Those skilled in the art will easily think of other embodiments of the present disclosure after considering the specification and practicing the invention disclosed herein. The present disclosure is intended to cover any variations, uses, or adaptive changes of the present disclosure. These variations, uses, or adaptive changes follow the general principles of the present disclosure and include common knowledge or conventional technical means in the technical field that are not disclosed in the present disclosure. The description and embodiments are only regarded as exemplary, and the true scope and spirit of the present disclosure are indicated by the appended claim.

What is claimed is:

1. A display panel, comprising:
   a drive back plate having a light transmitting region and a drive region at least partially surrounding the light transmitting region, wherein the drive region has a plurality of pixel circuits and at least comprises first pixel circuits and second pixel circuits;
   a transfer layer provided on a side of the drive back plate and comprising a plurality of layers of mutually insulated lead layers, wherein each of the lead layers comprises a plurality of mutually insulated leads, and each lead extends from the light transmitting region to the drive region and is connected to one of the first pixel circuits; and
   a light emitting layer provided on a side of the transfer layer away from the drive back plate and comprising a plurality of light emitting devices, wherein the light emitting device comprises a plurality of first light emitting devices located in the light transmitting region and a plurality of second light emitting devices located in the drive region, wherein:
   the first light emitting devices are connected to the first pixel circuits in a one-to-one correspondence through the leads in each lead layer, and the second pixel circuits are connected to the second light emitting devices in a one-to-one correspondence;
   the light emitting device comprises: a first electrode provided on a surface of the transfer layer away from the drive back plate, and the first electrode has an electrode portion and a wiring portion located outside an edge of the electrode portion;

each of the first electrodes is connected to one of the leads through the wiring portion and a transfer hole in the transfer layer, a light emitting function layer is provided on a surface of the first electrode away from the drive back plate, and a second electrode is provided on a surface of the light emitting function layer away from the drive back plate;

a plurality of layers of the lead layers at least comprises a first lead layer, a second lead layer, and a third lead layer that are sequentially distributed from the drive back plate to the light emitting layer, a lead of the first lead layer comprising a first lead, a lead of the second lead layer comprising a second lead, and a lead of the third lead layer comprising a third lead; and a region of the transfer layer corresponding to the light emitting region comprises a plurality of routing regions distributed in an array, each of the routing regions comprises a target routing region, the target routing region is located at a side of a first central axis, and the target routing region comprises a first sub-region, a second sub-region, a third sub-region sequentially distributed towards the first central axis along a row direction, the first central axis being a central axis of the light transmitting region along a column direction.

2. The display panel according to claim 1, wherein:
transfer holes in the first sub-region are first transfer holes, transfer holes in the second sub-region are second transfer holes, and transfer holes in the third sub-region are third transfer holes; and a wiring portion corresponding to the first sub-region is connected to the corresponding first pixel circuit through the first transfer hole and the first lead; a wiring portion corresponding to the second sub-region is connected to the corresponding first pixel circuit through the second transfer hole and the second lead; and a wiring portion corresponding to the third sub-region is connected to the corresponding first pixel circuit through the third transfer hole and the third lead.

3. The display panel according to claim 2, wherein, in the first sub-region, the first transfer holes are distributed in N rows and M columns, and at most M first leads are distributed between the first transfer holes of any adjacent two rows, both N and M being positive integers.

4. The display panel according to claim 2, wherein, in the second sub-region, the second transfer holes are distributed in N rows and M columns, and at most M second leads are distributed between the second transfer holes of any adjacent two rows.

5. The display panel according to claim 2, wherein, in the third sub-region, the third transfer holes are distributed in N rows and M columns, and at most M third leads are distributed between the third transfer holes of any adjacent two rows.

6. The display panel according to claim 2, wherein:
the target routing region further comprises a fourth sub-region, the fourth sub-region is located at a side of the third sub-region away from the first sub-region, transfer holes in the fourth sub-region are fourth transfer holes; and
the lead of the first lead layer further comprises a fourth lead insulated from the first lead, and at least a portion of the wiring portion corresponding to the fourth sub-region is connected to the corresponding first pixel circuit through the fourth transfer hole and the fourth lead.

7. The display panel according to claim 6, wherein the lead of the second lead layer further comprises a fifth lead insulated from the second lead; and at least a portion of the wiring portion corresponding to the fourth sub-region is connected to the corresponding first pixel circuit through the fourth transfer hole and the fifth lead.

8. The display panel according to claim 7, wherein the lead of the third lead layer further comprises a sixth lead insulated from the third lead; and at least a portion of the wiring portion corresponding to the fourth sub-region is connected to the corresponding first pixel circuit through the fourth transfer hole and the sixth lead.

9. The display panel according to claim 8, wherein the fourth sub-region comprises a first secondary sub-region and a second secondary sub-region, the first secondary sub-region and the second secondary sub-region are symmetrical with respect to a second central axis, and the lead in the first secondary sub-region region and the lead in the second secondary sub-region are symmetrical with respect to the second central axis; the second central axis is a central axis of the target routing region along the row direction.

10. The display panel according to claim 9, wherein the first lead, the second lead, and the third lead comprise:
a lead-out section extending along the column direction and connected to the transfer hole; and
an extension section extending in the row direction, and having one end connected to the lead-out section and the other end extending to a region of the transfer layer corresponding to the drive region.

11. The display panel according to claim 9, wherein the fourth lead, the fifth lead, and at least a portion of the sixth lead comprises:
a lead-out section extending along the column direction and connected to the transfer hole; and
an extension section comprising a first extension section and a second extension section, wherein the first extension section extends along the row direction, and has one end connected to the lead-out section and the other end located within the target routing region;
wherein the second extension section extends along the column direction, and has one end connected to the first extension section and the other end extending to a region of the transfer layer corresponding to the drive region.

12. The display panel according to claim 11, wherein the second extension section of the fourth lead is located in the second sub-region; the second extension section of the fifth lead is located in the third sub-region; and the second extension section of the sixth lead is located in the fourth sub-region.

13. The display panel according to claim 11, wherein in the fourth sub-region, the fourth transfer holes are distributed in i rows and j columns, and at most j−1 second extension sections are distributed between the fourth transfer holes of any adjacent two columns;
both i and j are positive integers.

14. The display panel according to claim 2, wherein:
the leads at two sides of the first central axis are symmetrical with respect to the first central axis;
the leads at two sides of the third central axis are symmetrical with respect to the third central axis; and
the third central axis is a central axis of the light transmitting region along the row direction.

15. The display panel according to claim 2, wherein:
the first lead layer is provided on a surface of the drive back plate close to the light emitting layer; and
the transfer layer further comprises:

a first flat layer covering the first lead layer and a surface of the drive back plate close to the light emitting layer, wherein the second lead layer is provided on a surface of the first flat layer away from the drive back plate;
a second flat layer covering the second lead layer and a surface of the first flat layer close to the light emitting layer, wherein the third lead layer is provided on a surface of the second flat layer away from the drive back plate; and
a third flat layer covering the third lead layer and a surface of the second flat layer close to the light emitting layer, wherein the light emitting layer is provided on a surface of the third flat layer away from the drive back plate.

16. The display panel according to claim 1, wherein a density of the first light emitting device in the light transmitting region is the same as a density of the second light emitting device in the drive region.

17. The display panel according to claim 1, wherein the drive region comprises:
a pixel region, at least partially surrounding outside the light transmitting region, wherein one side of the light transmitting region coincides with one side of the pixel region;
a frame region, surrounding outside the pixel region,
wherein at least a portion of the first pixel circuits is distributed in the pixel region, and at most a portion of the first pixel circuits is distributed in the frame region.

18. A terminal device, comprising:
the display panel according to claim 1; and
an imaging apparatus provided on a backlight side of the display panel and provided directly opposite to the light transmitting region for capturing an image through the light transmitting region.

19. A method of manufacturing a display panel, comprising:
forming a drive back plate, wherein the drive back plate has a light transmitting region and a drive region at least partially surrounding the light transmitting region, and the drive region has a plurality of pixel circuits and at least comprises first pixel circuits and second pixel circuits;
forming a transfer layer on a side of the drive back plate, wherein the transfer layer comprises a plurality of layers of mutually insulated lead layers, each of the lead layers comprises a plurality of mutually insulated leads, and each lead extends from the light transmitting region to the drive region and is connected to one of the first pixel circuits; and
forming a light emitting layer on a surface of the transfer layer away from the drive back plate, wherein the light emitting layer comprises a plurality of light emitting devices, the light emitting device comprises a plurality of first light emitting devices located in the light transmitting region and a plurality of second light emitting devices located in the drive region, wherein:
the first light emitting devices are connected to the first pixel circuits in a one-to-one correspondence through the leads in each lead layer, and the second pixel circuits are connected to the second light emitting devices in a one-to-one correspondence;
the light emitting device comprises: a first electrode provided on a surface of the transfer layer away from the drive back plate, and the first electrode has an electrode portion and a wiring portion located outside an edge of the electrode portion;
each of the first electrodes is connected to one of the leads through the wiring portion and a transfer hole in the transfer layer, a light emitting function layer is provided on a surface of the first electrode away from the drive back plate, and a second electrode is provided on a surface of the light emitting function layer away from the drive back plate,
a plurality of layers of the lead layers at least comprises a first lead layer, a second lead layer, and a third lead layer that are sequentially distributed from the drive back plate to the light emitting layer, a lead of the first lead layer comprising a first lead, a lead of the second lead layer comprising a second lead, and a lead of the third lead layer comprising a third lead; and
a region of the transfer layer corresponding to the light emitting region comprises a plurality of routing regions distributed in an array, each of the routing regions comprising a target routing region, the target routing region being located at a side of a first central axis, and the target routing region comprising a first sub-region, a second sub-region, a third sub-region sequentially distributed towards the first central axis along a row direction, the first central axis being a central axis of the light transmitting region along a column direction.

20. A display apparatus, comprising:
a display panel, comprising:
a drive back plate having a light transmitting region and a drive region at least partially surrounding the light transmitting region, wherein the drive region has a plurality of pixel circuits and at least comprises first pixel circuits and second pixel circuits;
a transfer layer provided on a side of the drive back plate and comprising a plurality of layers of mutually insulated lead layers, wherein each of the lead layers comprises a plurality of mutually insulated leads, and each lead extends from the light transmitting region to the drive region and is connected to one of the first pixel circuits; and
a light emitting layer provided on a side of the transfer layer away from the drive back plate and comprising a plurality of light emitting devices, wherein the light emitting device comprises a plurality of first light emitting devices located in the light transmitting region and a plurality of second light emitting devices located in the drive region, wherein;
the first light emitting devices are connected to the first pixel circuits in a one-to-one correspondence through the leads in each lead layer; and the second pixel circuits are connected to the second light emitting devices in a one-to-one correspondence,
the light emitting device comprises: a first electrode provided on a surface of the transfer layer away from the drive back plate, and the first electrode has an electrode portion and a wiring portion located outside an edge of the electrode portion;
each of the first electrodes is connected to one of the leads through the wiring portion and a transfer hole in the transfer layer, a light emitting function layer is provided on a surface of the first electrode away from the drive back plate, and a second electrode is provided on a surface of the light emitting function layer away from the drive back plate;
a plurality of layers of the lead layers at least comprises a first lead layer, a second lead layer, and a third lead layer that are sequentially distributed from the drive back plate to the light emitting layer, a lead of the first lead layer comprising a first lead, a lead of the second lead layer comprising a second lead, and a lead of the third lead layer comprising a third lead; and a region of the transfer layer corresponding to the light emitting region comprises a plurality of routing regions distributed in an array, each of the routing regions comprising a target routing region, the target routing region being located at a side of a first central axis, and the target routing region comprising a first sub-region, a second sub-region, a third sub-region sequentially distributed towards the first central axis along a row direction, the first central axis being a central axis of the light transmitting region along a column direction.

* * * * *

UNITED STATES PATENT AND TRADEMARK OFFICE
CERTIFICATE OF CORRECTION

| | | |
|---|---|---|
| PATENT NO. | : 12,136,389 B2 | Page 1 of 1 |
| APPLICATION NO. | : 17/427151 | |
| DATED | : November 5, 2024 | |
| INVENTOR(S) | : Lili Du et al. | |

It is certified that error appears in the above-identified patent and that said Letters Patent is hereby corrected as shown below:

On the Title Page

Item (73):
"CHENGDU BO OPTOELECTRONICS TECHNOLOGY., LTD., Sichuan (CN); BOE TECHNOLOGY GROUP CO., LTD., Beijing (CN)"

Should be changed to:
--CHENGDU BOE OPTOELECTRONICS TECHNOLOGY CO., LTD., Chengdu, Sichuan (CN); BOE TECHNOLOGY GROUP CO., LTD., Beijing (CN)--

Signed and Sealed this
Seventeenth Day of December, 2024

Derrick Brent
*Acting Director of the United States Patent and Trademark Office*